(12) United States Patent
Nanataki et al.

(10) Patent No.: US 7,477,004 B2
(45) Date of Patent: Jan. 13, 2009

(54) PIEZOELECTRIC/ELECTROSTRICTIVE PORCELAIN COMPOSITION, PIEZOELECTRIC/ELECTROSTRICTIVE ARTICLE, AND PIEZOELECTRIC/ELECTROSTRICTIVE FILM TYPE ELEMENT

(75) Inventors: Tsutomu Nanataki, Toyoake (JP); Hirofumi Yamaguchi, Nagoya (JP); Toshikatsu Kashiwaya, Inazawa (JP)

(73) Assignee: NGK Insulators, Ltd., Nagoya (JP)

( * ) Notice: Subject to any disclaimer, the term of this patent is extended or adjusted under 35 U.S.C. 154(b) by 481 days.

(21) Appl. No.: 11/232,787

(22) Filed: Sep. 22, 2005

(65) Prior Publication Data

US 2006/0066180 A1 Mar. 30, 2006

Related U.S. Application Data

(60) Provisional application No. 60/614,352, filed on Sep. 29, 2004.

(51) Int. Cl.
*H01L 41/187* (2006.01)

(52) U.S. Cl. ............... 310/358; 252/62.9 PZ; 501/134

(58) Field of Classification Search .......... 310/358; 252/62.9 PZ; 501/134
See application file for complete search history.

(56) References Cited

U.S. PATENT DOCUMENTS

| | | |
|---|---|---|
| 6,503,416 B2 | 1/2003 | Takeda et al. |
| 7,309,450 B2 * | 12/2007 | Nanao et al. ............ 252/62.9 R |
| 2002/0049130 A1 | 4/2002 | Takeda et al. |
| 2003/0178606 A1 | 9/2003 | Nonoyama et al. |
| 2004/0058797 A1 | 3/2004 | Nonoyama et al. |
| 2004/0127344 A1 | 7/2004 | Sato et al. |
| 2005/0006618 A1 | 1/2005 | Nanao et al. |
| 2008/0095927 A1 * | 4/2008 | Nanataki et al. ............ 427/100 |

FOREIGN PATENT DOCUMENTS

| | | |
|---|---|---|
| EP | 1796183 A1 * | 6/2007 |
| JP | 44-17103 | 7/1969 |
| JP | 45-8145 | 3/1970 |
| JP | 2002-068835 | 3/2002 |
| JP | 2002-068836 | 3/2002 |
| JP | 2002-321975 | 11/2002 |
| JP | 2003-221276 | 8/2003 |
| JP | 2003-252681 | 9/2003 |
| JP | 2003-277145 | 10/2003 |
| JP | 2004-244299 | 9/2004 |
| JP | 2008050206 A * | 3/2008 |

* cited by examiner

*Primary Examiner*—Jaydi A San Martin
(74) *Attorney, Agent, or Firm*—Burr & Brown

(57) ABSTRACT

A piezoelectric/electrostrictive porcelain composition which exhibits superior piezoelectric/electrostrictive characteristics without containing lead (Pb) is provided. A main component of the piezoelectric/electrostrictive composition is a binary solid solution represented by the general formula (1): $(1-n)(Ag_{1-a-b-c}Li_aNa_bK_c)(Nb_{1-x-y-z}Ta_xSb_yV_z)O_3+nM^1M^2O_3$; wherein $0 \leq a \leq 0.2$, $0 \leq b \leq 0.95$, $0 \leq c \leq 0.95$, $0<(1-a-b-c) \leq 1$, $0 \leq x \leq 0.5$, $0 \leq y \leq 0.2$, $0 \leq z \leq 0.2$, $0 \leq (y+z) \leq 0.3$, $0 \leq n \leq 0.2$, and wherein $M^1$ and $M^2$ are combinations of metal which satisfy pretermined conditions.

12 Claims, 9 Drawing Sheets

PIEZOELECTRIC/ELECTROSTRICTIVE PORCELAIN COMPOSITION, PIEZOELECTRIC/ELECTROSTRICTIVE ARTICLE, AND PIEZOELECTRIC/ELECTROSTRICTIVE FILM TYPE ELEMENT

CROSS REFERENCE TO RELATED APPLICATION

This application claims the benefit under 35 USC § 119(e) of U.S. Provisional Application Ser. No. 60/614,352, filed Sep. 29, 2004, the entirety of which is incorporated herein by reference.

BACKGROUND OF THE INVENTION

1. Field of the Invention

The present invention relates to a piezoelectric/electrostrictive porcelain composition, a piezoelectric/electrostrictive article and a piezoelectric/electrostrictive film type element, and more particularly, it relates to a piezoelectric/electrostrictive porcelain composition capable of manufacturing a piezoelectric/electrostrictive article or a piezoelectric/electrostrictive film type element which exhibits superior piezoelectric/electrostrictive characteristics and in which even environments are taken into consideration, and a piezoelectric/electrostrictive article and a piezoelectric/electrostrictive film type element using this composition.

2. Description of the Related Art

Heretofore, a piezoelectric/electrostrictive element has been known as an element which can control a micro displacement of an order of sub-microns. In particular, a piezoelectric/electrostrictive film type element is preferable for the control of the micro displacement, and it is to be noted that in the above element, a piezoelectric/electrostrictive portion constituted of a piezoelectric/electrostrictive porcelain composition, and an electrode portion to which a voltage is applied are layered on a substrate made of a ceramic. In addition, the above element has superior characteristics such as a high electromechanical conversion efficiency, a high-speed response, a high durability, and a reduced power consumption. These piezoelectric/electrostrictive elements are used in various applications such as a piezoelectric pressure sensor, a probe moving mechanism of a scanning tunnel microscope, a rectilinear guide mechanism in a super-precision working device, a servo valve for hydraulic control, a head of a VTR device, a pixel constituting a flat panel type image display device, and a head of an ink jet printer.

Moreover, various studies have been made as to the piezoelectric/electrostrictive porcelain composition constituting the piezoelectric/electrostrictive portion is variously investigated. For example, there is disclosed a $Pb(Mg_{1/3}Nb_{2/3})O_3$—$PbZrO_3$—$PbTiO_3$ ternary solid solution material (PZT-based composition), or a piezoelectric/electrostrictive porcelain composition in which a part of Pb in the composition is replaced with Sr, La or the like (see, e.g., Patent Documents 1, 2). As to the piezoelectric/electrostrictive portion itself as the most important portion which determines piezoelectric/electrostrictive characteristics of the piezoelectric/electrostrictive element, it is expected that the piezoelectric/electrostrictive element having superior piezoelectric/electrostrictive characteristics (e.g., piezoelectric d constant) can be obtained.

Additionally, the PZT-based composition unavoidably contains lead (Pb). Especially in recent years, there has been a tendency to regard as a problem an influence on global environments, such as elution of lead (Pb) by acid rain. Therefore, as a piezoelectric/electrostrictive material in which the influence on the environment is considered, there is disclosed a piezoelectric porcelain (or a piezoelectric porcelain composition) capable of providing a piezoelectric article or a piezoelectric element which exhibits satisfactory piezoelectric/electrostrictive characteristics without containing lead (Pb) (see, e.g., Patent Documents 3 to 6).

However, it is the state of the art that a large displacement, in the case of the piezoelectric article and the like obtained using the piezoelectric porcelain (or the piezoelectric porcelain composition) disclosed in Patent Documents 3 to 6, cannot be easily obtained, as compared with the piezoelectric article and the like obtained using the lead (Pb)-containing PZT-based composition. One cannot help saying that the PZT-based composition is superior in respect of superiority/inferiority of the piezoelectric/electrostrictive characteristics. Therefore, there has been a necessity of developing a piezoelectric/electrostrictive porcelain composition capable of obtaining a piezoelectric/electrostrictive article or a piezoelectric/electrostrictive element which exhibits superior piezoelectric/electrostrictive characteristics even in a case where lead (Pb) is not contained.

[Patent Document 1] JP-B-44-17103
[Patent Document 2] JP-B-45-8145
[Patent Document 3] JP-A-2003-221276
[Patent Document 4] JP-A-2003-277145
[Patent Document 5] JP-A-2002-68836
[Patent Document 6] JP-A-2004-244299

SUMMARY OF THE INVENTION

The present invention has been developed in view of the problems of the prior art, and an object thereof is to provide a piezoelectric/electrostrictive porcelain composition capable of manufacturing a piezoelectric/electrostrictive article or a piezoelectric/electrostrictive film type element which exhibits superior piezoelectric/electrostrictive characteristics without containing lead (Pb) and in which an especially large displacement can be obtained. Furthermore, an object of the present invention is to provide a piezoelectric/electrostrictive article which exhibits superior piezoelectric/electrostrictive characteristics without containing lead (Pb) and in which an especially large displacement can be obtained. Additionally, an object of the present invention is to provide a piezoelectric/electrostrictive film type element which exhibits superior piezoelectric/electrostrictive characteristics without containing lead (Pb) and in which an especially large displacement can be obtained.

As a result of intensive investigation for achieving the above-described objects, the present inventors have found that the above-described objects can be achieved using as a main component a binary solid solution which is represented by a predetermined composition formula and which does not contain lead (Pb), and they have completed the present invention.

That is, according to the present invention, there are provided the following piezoelectric/electrostrictive porcelain composition, piezoelectric/electrostrictive article, and piezoelectric/electrostrictive film type element.

According to a first aspect of the present invention, a piezoelectric/electrostrictive porcelain composition is provided which contains a main component including a binary solid solution represented by the following general formula (1):

$$(1-n)(Ag_{1-a-b-c}Li_aNa_bK_c)Nb_{1-x-y-z}Ta_xSb_yV_z)O_3 + nM^1M^2O_3 \quad (1),$$

wherein 0≦a≦02, 0≦b≦0.95, 0≦c≦0.95, 0<(1−a−b−c)≦1, 0x≦0.5, 0y ≦0.2, 0≦z≦0.2, 0≦(y+z)≦0.3, 0≦n≦0.2, and $M^1$ and $M^2$ satisfy any of the following combinations A to C:

combination A: $M^1$ is a monovalent metal element, and $M^2$ is a combination of two or more kinds of metal elements which are quinquevalent on average;

combination B: $M^1$ is a bivalent metal element or a combination of two or more kinds of metal elements which are bivalent on average, and $M^2$ is a quadrivalent metal element or a combination of two or more kinds of metal elements which are quadrivalent on average; and combination C: $M^1$ is a tervalent metal element or a combination of two or more kinds of metal elements which are tervalent on average, and $M^2$ is a tervalent metal element or a combination of two or more kinds of metal elements which are tervalent on average.

According to a second aspect of the present invention, the piezoelectric/electrostrictive porcelain composition according to the first aspect contains an oxide of at least one kind of metal element selected from a group consisting of Li, Na, Mg, Al, Si, K, Ca, Sc, Ti, V, Cr, Mn, Fe, Co, Ni, Cu, Zn, Ga, Ge, Rb, Sr, Y, Zr, Nb, Mo, Pd, Ag, Cd, In, Sn, Sb, Ba, Hf, Ta, W, Pt, Au, Pb, Bi, La, Ce, Pr, Nd, Sm, Eu, Gd, Tb, Dy, Ho, Er, Tm, Yb, and Lu.

According to a third aspect of the present invention, a piezoelectric/electrostrictive article is provided comprising crystal grains of the piezoelectric/electrostrictive porcelain composition according to the first or second aspects.

According to a fourth aspect of the present invention, the whole shape of the piezoelectric/electrostrictive article according to the third aspect is sheet-like.

According to a fifth aspect of the present invention, a piezoelectric/electrostrictive film type element is provided, comprising a thin substrate made of a ceramic, a film-like piezoelectric/electrostrictive portion, and a film-like electrode electrically connected to the piezoelectric/electrostrictive portion. The piezoelectric/electrostrictive portion is bonded onto the substrate directly or via the electrode, and the piezoelectric/electrostrictive portion comprises crystal grains constituted of the piezoelectric/electrostrictive porcelain composition according to the first or second aspects of the present invention.

According to the sixth aspect of the present invention, the piezoelectric/electrostrictive film type element according to the fifth aspect comprises a plurality of piezoelectric/electrostrictive portions, and a plurality of electrodes, wherein the plurality of piezoelectric/electrostrictive portions are held and layered alternately with the plurality of electrodes.

According to a seventh aspect of the present invention, the piezoelectric/electrostrictive film type element according to the fifth or sixth aspects is provided, wherein one of the piezoelectric/electrostrictive portions has a thickness in a range of 0.5 to 50 μm.

The piezoelectric/electrostrictive porcelain composition of the present invention makes it possible to manufacture a piezoelectric/electrostrictive article or a piezoelectric/electrostrictive film type element according to the present invention which exhibit superior piezoelectric/electrostrictive characteristics without containing lead (Pb) and which can obtain an especially large displacement.

DETAILED DESCRIPTION OF THE INVENTION

Figure 1:
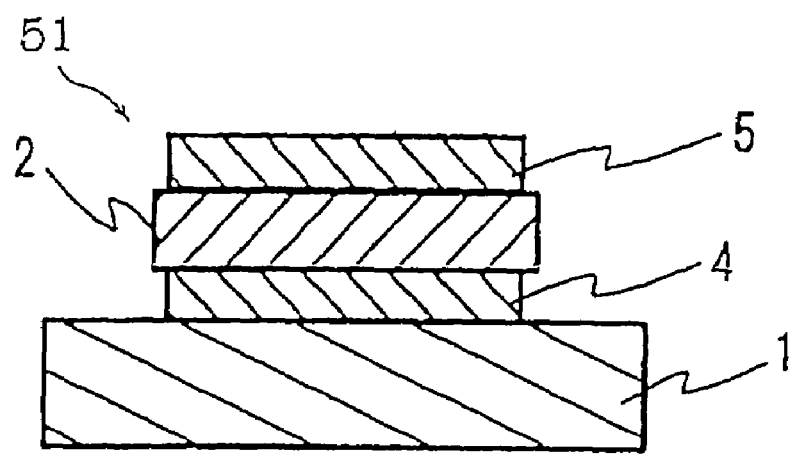
FIG. 1 is a sectional view schematically showing one embodiment of a piezoelectric/electrostrictive film type element of the present invention.

The best mode for carrying out the present invention will be described hereinafter, but the present invention is not limited to the following embodiments, and it should be understood that the following embodiments are appropriately modified or improved based on ordinary knowledge of a person skilled in the art within a range that does not depart from the scope of the present invention.

One embodiment of a piezoelectric/electrostrictive porcelain composition of the present invention is a piezoelectric/electrostrictive porcelain composition containing as a main component a binary solid solution represented by the following general formula (1). It is to be noted that in the present specification, "containing the binary solid solution as the main component" means that a ratio of the binary solid solution with respect to the whole piezoelectric/electrostrictive porcelain composition is 99.5 mass % or more, preferably 99.8 mass % or more:

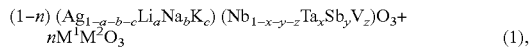

$$(1-n)(Ag_{1-a-b-c}Li_aNa_bK_c)(Nb_{1-x-y-z}Ta_xSb_yV_z)O_3 + nM^1M^2O_3 \quad (1),$$

wherein $0 \leq a \leq 0.2$, $0 \leq b \leq 0.95$, $0 \leq c \leq 0.95$, $0 < (1-a-b-c) \leq 1$, $0 \leq x \leq 0.5$, $0 \leq y \leq 0.2$, $0 \leq z \leq 0.2$, $0 \leq (y+z) \leq 0.3$, and $0 \leq n \leq 0.2$.

Here, in the above general formula (1), $M^1$ and $M^2$ are metal elements which satisfy any of the following combinations A to C. Specifically, as to $M^1$, examples of a monovalent metal element include Ag, Li, Na, and K, examples of a bivalent metal element include Mg, Ca, Sr, and Ba, and examples of a tervalent metal element include Sc, Y, Bi, La, Nd, Sm, Eu, Gd, Dy, Ho, Er, Tm, Yb, and Lu. On the other hand, as to $M^2$, examples of a bivalent metal element include Mg, Ni, and Zn, examples of a tervalent metal element include Al, Cr, Fe, Co, and Y, examples of a quadrivalent metal element include Ti, Zr, Hf, Sn, Mn, Ge, and Si, examples of a quinquevalent metal element include Nb, Ta, Sb, and V, and examples of a sexivalent metal element include W and Mo. It is to be noted that as to a certain valency, each of $M^1$ and $M^2$ may be a combination of a plurality of metal elements having the equal valency. For example, when $M^2$ is the quinquevalent metal element, it may be $(Nb_{0.5}Ta_{0.5})$. Furthermore, when it is a combination of two or more kinds of metal elements which are quinquevalent on average, it may be a combination such as $(Ti_{0.5}Zr_{0.5})_{1/2}(W_{0.7}Mo_{0.3})_{1/2}$.

1. "Combination"

$M^1$ is a monovalent metal element, and $M^2$ is a combination of two or more metal elements which are quinquevalent on average. Preferable examples of $M^1$ include Ag, Li, Na, and K. Preferable examples of $M^2$ include $(Ti_{1/2}W_{1/2})$, $(Zr_{1/2}W_{1/2})$, $(Mn_{1/2}W_{1/2})$, $(Ti_{1/2}Mo_{1/2})$, $(Zr_{1/2}Mo_{1/2})$, $(Si_{1/2}W_{1/2})$, $(Ge_{1/2}Mo_{1/2})$, $(Al_{1/3}W_{2/3})$, $(Fe_{1/3}Mo_{2/3})$, $(Mg_{1/4}W_{3/4})$, $(Fe_{2/12}Ti_{3/12}W_{7/12})$, and $(Ti_{1/3}Nb_{1/3}W_{1/3})$. Therefore, preferable examples of the combination include Ag$(Ti_{1/2}W_{1/2})O_3$ and Li$(Ti_{1/3}Nb_{1/3}W_{1/3})O_3$.

2. "Combination B"

$M^1$ is a bivalent metal element or a combination of two or more kinds of metal elements which are bivalent on average, and $M^2$ is a quadrivalent metal element or a combination of two or more kinds of metal elements which are quadrivalent on average. As to $M^1$, examples of the combination of two or more kinds of metal elements which are bivalent on average include $(Na_{1/2}Bi_{1/2})$, $(K_{1/2}Bi_{1/2})$, $(Li_{1/2}Bi_{1/2})$, $(Na_{1/2}La_{1/2})$, $(K_{1/2}La_{1/2})$, $(Li_{1/2}La_{1/2})$, $(Na_{1/4}Mg_{1/2}Bi_{1/4})$, and $(Na_{1/3}Sr_{1/3}La_{1/3})$. As to $M^2$, preferable examples of the combination of two or more metal elements which are quadrivalent on average include $(Mg_{1/3}Nb_{2/3})$, $(Zn_{1/3}Nb_{2/3})$, $(Mg_{1/3}Ta_{2/3})$, $(Mg_{1/3}Sb_{2/3})$, $(Fe_{1/2}Nb_{1/2})$, $(Mg_{1/2}W_{1/2})$, $(Ni_{1/2}Mo_{1/2})$, $(Mg_{5/12}Nb_{4/12}W_{3/12})$, and $(Mg_{1/4}Ti_{1/4}W_{2/4})$. Therefore, preferable examples of the combination include Ba $(Mg_{5/12}Nb_{4/12}W_{3/12})O_3$ and $(Na_{1/2}Bi_{1/2})(Mg_{1/3}Nb_{2/3})O_3$.

3. "Combination C"

$M^1$ is a tervalent metal element or a combination of two or more kinds of metal elements which are tervalent on average, and $M^2$ is a tervalent metal element or a combination of two or more kinds of metal elements which are tervalent on average. As to $M^1$, preferable examples of the combination of two or more kinds of metal elements which are tervalent on average include $(Ca_{1/2}Ce_{1/2})$, $(Sr_{1/2}Ce_{1/2})$, and $(Ba_{1/2}Ce_{1/2})$. As to $M^2$, preferable examples of the combination of two or more kinds of metal elements which are tervalent on average include $(Mg_{2/3}Nb_{1/3})$, $(Ni_{2/3}Nb_{1/3})$, $(Zn_{2/3}Nb_{1/3})$, $(Mg_{2/3}Ta_{1/3})$, $(Mg_{2/3}Sb_{1/3})$, $(Mg_{1/2}Ti_{1/2})$, $(Ni_{1/2}Zr_{1/2})$, $(Mg_{3/4}W_{1/4})$, $(Mg_{1/3}Cr_{1/3}Ti_{1/3})$, $(Mg_{1/3}Fe_{1/3}Zr_{1/3})$, and $(Mg_{7/12}Ti_{3/12}Nb_{2/12})$. Therefore, preferable examples of the combination include La$(Mg_{7/12}Ti_{3/12}Nb_{2/12})O_3$ and $(Ba_{1/2}Ce_{1/2})(Mg_{2/3}Nb_{1/3})O_3$.

The piezoelectric/electrostrictive porcelain composition of the present embodiment preferably contains an oxide of at least one kind of metal element selected from a group consisting of Li, Na, Mg, Al, Si, K, Ca, Sc, Ti, V, Cr, Mn, Fe, Co, Ni, Cu, Zn, Ga, Ge, Rb, Sr, Y, Zr, Nb, Mo, Pd, Ag, Cd, In, Sn, Sb, Ba, Hf, Ta, W, Pt, Au, Pb, Bi, La, Ce, Pr, Nd, Sm, Eu, Gd, Tb, Dy, Ho, Er, Tm, Yb, and Lu. This is preferable because it is possible to provide the piezoelectric/electrostrictive article or the piezoelectric/electrostrictive film type element which exhibits more superior piezoelectric/electrostrictive characteristics.

Here, "containing the oxide of the metal element" mentioned in the present specification refers to a case where the oxide of the metal element exists in such a state as to be clearly distinguishable from the binary solid solution represented by the above general formula (1), and additionally indicates a concept including even a state in which the oxide of the metal element is taken into the general formula (1) representing the binary solid solution. Therefore, the piezoelectric/electrostrictive porcelain composition of the present invention also includes a piezoelectric/electrostrictive porcelain composition to which the oxide of the metal element included in the general formula (1) is added more than that represented by the general formula (1).

Next, one embodiment of a piezoelectric/electrostrictive article of the present invention will be described. In the present embodiment, the piezoelectric/electrostrictive article is a piezoelectric/electrostrictive article comprising crystal grains constituted of any of the piezoelectric/electrostrictive porcelain compositions according to the above-described embodiments of the present invention. That is, in the present embodiment, the piezoelectric/electrostrictive article comprises crystal grains constituted of the piezoelectric/electrostrictive porcelain composition containing as the main component the binary solid solution represented by the above-described general formula (1). As described above, according to the piezoelectric/electrostrictive porcelain composition of the embodiment of the present invention, it is possible to manufacture the piezoelectric/electrostrictive article which exhibits superior piezoelectric/electrostrictive characteristics without containing lead (Pb) and in which an especially large displacement can be obtained. Therefore, according to the present embodiment, in the piezoelectric/electrostrictive article formed by the crystal grains obtained by sintering this composition, environments are taken into consideration, the superior piezoelectric/electrostrictive characteristics are exhibited, and the especially large displacement can be obtained.

Moreover, according to the present embodiment, a mean grain size of the crystal grains constituting the piezoelectric/electrostrictive article is preferably 0.3 to 20 μm, more preferably 0.5 to 15 μm, especially preferably 0.8 to 10 μm. When the mean grain size is less than 0.3 μm, a domain does not sufficiently develop in the piezoelectric/electrostrictive article in some case. Therefore, the piezoelectric/electrostrictive characteristics sometimes drop. On the other hand, when the mean grain size is over 20 μm, the domain in the piezoelectric/electrostrictive article sufficiently develops, but the domain does not easily move, and the piezoelectric/electrostrictive characteristics sometimes diminish. It is to be noted that in the present embodiment, a whole shape of the piezoelectric/electrostrictive article can be formed into various shapes. Specifically, preferable examples of the shape include a block-like shape (i.e., so-called bulk article) and a sheet-like shape.

Next, an embodiment of a piezoelectric/electrostrictive film type element of the present invention will be described specifically with reference to the drawings. As shown in FIG. 1, in the present embodiment, a piezoelectric/electrostrictive film type element 51 comprises a substrate 1 made of a ceramic, a film-like piezoelectric/electrostrictive portion 2, and film-like electrodes 4, 5 electrically connected to the piezoelectric/electrostrictive portion 2. The piezoelectric/electrostrictive portion 2 is bonded onto the substrate 1 via the electrode 4. It is to be noted that the portion may be directly bonded onto the substrate without disposing any electrode. It is to be noted that "bonded" in the present specification refers to a state in which the first piezoelectric/electrostrictive portion 2 is tightly integrated with the substrate 1 or the electrode 4 by a solid-phase reaction therebetween without using any organic or inorganic adhesive.

In the present embodiment, the piezoelectric/electrostrictive portion 2 of the piezoelectric/electrostrictive film type element 51 comprises crystal grains constituted of any of the piezoelectric/electrostrictive porcelain compositions which are the above-described embodiments of the present invention. That is, the piezoelectric/electrostrictive portion 2 of the piezoelectric/electrostrictive film type element 51 of the present embodiment comprises crystal grains constituted of the piezoelectric/electrostrictive porcelain composition containing as the main component the binary solid solution represented by the above-described general formula (1).

As described above, according to the piezoelectric/electrostrictive porcelain composition of the embodiment of the present invention, it is possible to manufacture the piezoelectric/electrostrictive film type element which exhibits superior piezoelectric/electrostrictive characteristics without containing lead (Pb) and which can obtain the especially large displacement. According to the present embodiment, in the piezoelectric/electrostrictive film type element provided with the piezoelectric/electrostrictive portion 2 formed using this composition, the environments are taken into consideration, the superior piezoelectric/electrostrictive characteristics are exhibited, and the especially large displacement can be obtained.

Moreover, in the present embodiment, the crystal grains constituting the piezoelectric/electrostrictive portion 2 of the piezoelectric/electrostrictive film type element 51 have a mean grain size of preferably 0.3 to 20 µm, more preferably 0.5 to 15 µm, especially preferably 0.8 to 10 µm. When the mean grain size is less than 0.3 µm, a domain does not sufficiently develop in the piezoelectric/electrostrictive portion 2 in some case. Therefore, there are sometimes generated a drop in flexural displacement, and a drop in linearity of the flexural displacement with respect to an electric field in a high-electric-field region. On the other hand, when the mean grain size is over 20 µm, the domain in the piezoelectric/electrostrictive portion 2 sufficiently develops, but the domain does not easily move, and the flexural displacement is reduced in some case.

Figure 3:
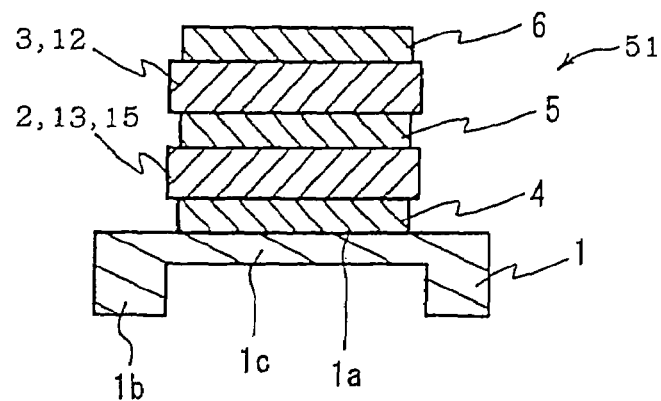
FIG. 3 is a sectional view schematically showing still another embodiment of the piezoelectric/electrostrictive film type element of the present invention.

Moreover, as shown in FIG. 3, in the present embodiment, the piezoelectric/electrostrictive film type element 51 comprises: a plurality of piezoelectric/electrostrictive portions 2, 3; and a plurality of electrodes 4, 5, 6. The plurality of piezoelectric/electrostrictive portions 2, 3 are preferably constituted to be held and layered alternately with the plurality of electrodes 4, 5, 6. This constitution is a so-called multilayered constitution, and a large flexural displacement can be preferably obtained at a low voltage.

In the piezoelectric/electrostrictive film type element 51 (see FIG. 1) of the present embodiment, the piezoelectric/electrostrictive portion 2 has a thickness of preferably 0.5 to 50 µm, more preferably 0.8 to 40 µm, and especially preferably 1.0 to 30 µm. When the thickness of the piezoelectric/electrostrictive portion 2 is less than 0.5 µm, compactness of the piezoelectric/electrostrictive portion sometimes becomes insufficient. On the other hand, when the thickness of the piezoelectric/electrostrictive portion 2 is over 50 µm, a compressive stress of the piezoelectric/electrostrictive porcelain composition at a sintering time increases, the substrate 1 needs to be thickened in order to prevent the substrate 1 from being destroyed, and it is sometimes difficult to cope with miniaturization of the element. It is to be noted that as shown in FIG. 3, in a case where the piezoelectric/electrostrictive film type element 51 is constituted to be of so-called multi-layered type, thicknesses of the piezoelectric/electrostrictive portions 2, 3 refer to the thickness of each of the piezoelectric/electrostrictive portions 2, 3.

In the embodiment of the present invention, the substrate constituting the piezoelectric/electrostrictive film type element is made of the ceramic. There is not any special restriction as to a type of ceramic, but in respect of heat resistance, chemical stability, and insulating properties, the ceramic preferably contains at least one selected from a group consisting of stabilized zirconium oxide, aluminum oxide, magnesium oxide, mullite, aluminum nitride, silicon nitride, and glass. Above all, stabilized zirconium oxide is more preferable because it has a high mechanical strength and a superior toughness. It is to be noted that "stabilized zirconium oxide" mentioned in the present invention refers to zirconium oxide in which phase transition of crystals is suppressed by addition of a stabilizer. In addition to stabilized zirconium oxide, partially stabilized zirconium oxide is included.

Examples of stabilized zirconium oxide include zirconium oxide containing as the stabilizer 1 to 30 mol % of calcium oxide, magnesium oxide, yttrium oxide, scandium oxide, ytterbium oxide, cerium oxide, or oxide of a rare earth metal. Above all, it is preferable to contain yttrium oxide as the stabilizer in that the mechanical strength of a vibrating portion is especially high. In this case, preferably 1.5 to 6 mol %, more preferably 2 to 4 mol % of yttrium oxide is contained. It is more preferable to contain 0.1 to 5 mol % of aluminum oxide. A crystal phase of stabilized zirconium oxide may be a mixed cubic phase+monoclinic phase, a mixed tetragonal phase+monoclinic phase, a mixed cubic phase+tetragonal phase+the monoclinic phase or the like, but from viewpoints of strength, toughness, and durability, it is preferable that a main crystal phase be the tetragonal phase or the mixed tetragonal phase+cubic phase or the like, but from viewpoints of strength, toughness, and durability, it is preferable that a main crystal phase be the tetragonal crystal or the mixed crystal phase of the tetragon+the cube crystal.

It is to be noted that the thickness of the substrate is preferably 1 µm to 1 mm, more preferably 1.5 to 500 µm, especially preferably 2 to 200 µm. When the thickness of the substrate is less than 1 µm, the mechanical strength of the piezoelectric/electrostrictive film type element sometimes drops. On the other hand, when the thickness is over 1 mm, and a voltage is applied to the piezoelectric/electrostrictive portion, rigidity of the substrate with respect to a generated compressive stress increases, and the flexural displacement of the piezoelectric/electrostrictive portion decreases in some case.

Figure 2:
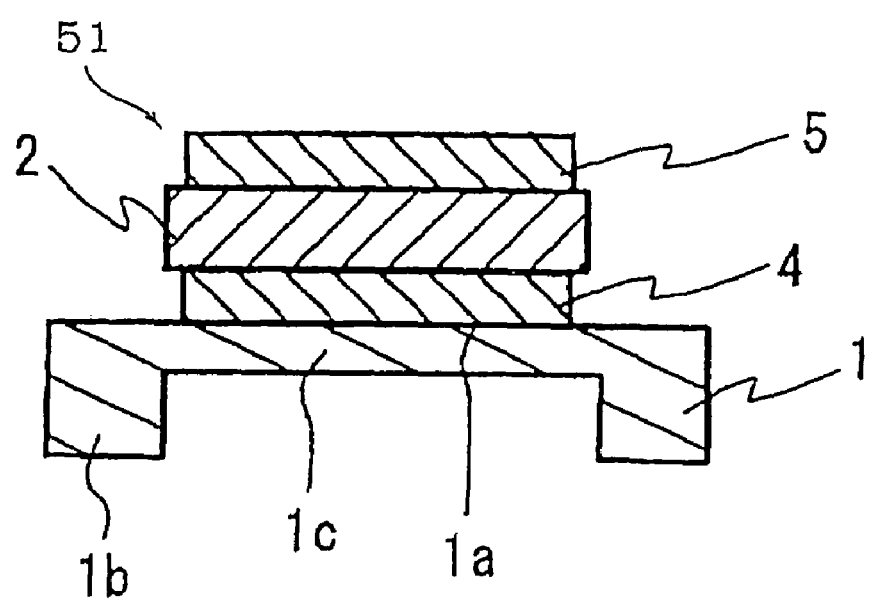
FIG. 2 is a sectional view schematically showing another embodiment of the piezoelectric/electrostrictive film type element of the present invention.
Figure 4:
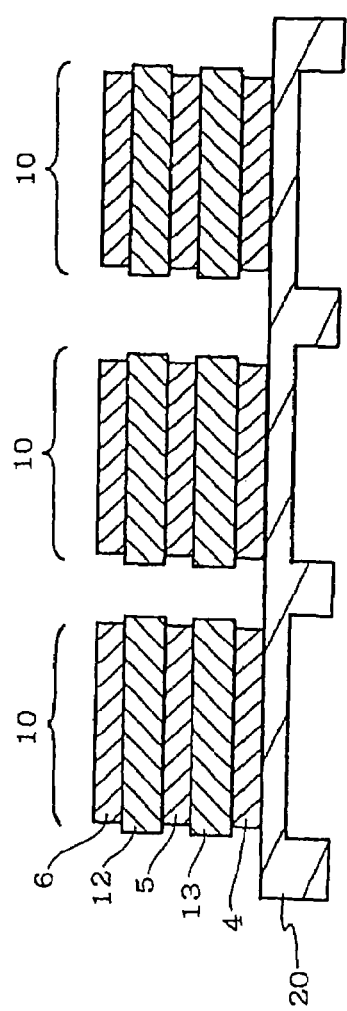
FIG. 4 is a sectional view schematically showing still another embodiment of the piezoelectric/electrostrictive film type element of the present invention.

Additionally, as shown in FIG. 2, a shape of the substrate 1 may be a shape comprising: a thin portion 1c having a bonded surface 1a formed on one surface, and having the above-described thickness; and a thick portion 1b disposed in a portion other than a portion corresponding to the bonded surface 1a, and having a thickness larger than that of the thin portion 1c. It is to be noted that the electrode 4 (or the piezoelectric/electrostrictive portion) is disposed in a region substantially corresponding to the bonded surface 1a. When the substrate 1 has such a shape, it is possible to obtain the piezoelectric/electrostrictive film type element having a sufficiently large flexural displacement and a high mechanical strength. As shown in FIG. 4, a common substrate 20 may be used in which the shape of the substrate 1 shown in FIG. 2 is continuously formed, and a plurality of piezoelectric/electrostrictive film type element units 10 may be disposed on this common substrate 20. Each unit includes a first piezoelectric/electrostrictive portion 12, a second piezoelectric/electrostrictive portion 13, and electrodes 4, 5, 6.

There is not any special restriction as to a substrate surface shape (shape of a surface onto which the electrode 4 is bonded in FIG. 1) in the piezoelectric/electrostrictive film type element according to the embodiment of the present invention. Examples of the surface shape include a rectangular shape, a square shape, a triangular shape, an elliptic shape, a perfect circle shape, a curved square shape, a curved rectangular shape, a composite shape obtained by combining these shapes and the like. There is not any special restriction as to the shape of the whole substrate, and it may be a capsule shape having an appropriate internal space.

Figure 7:
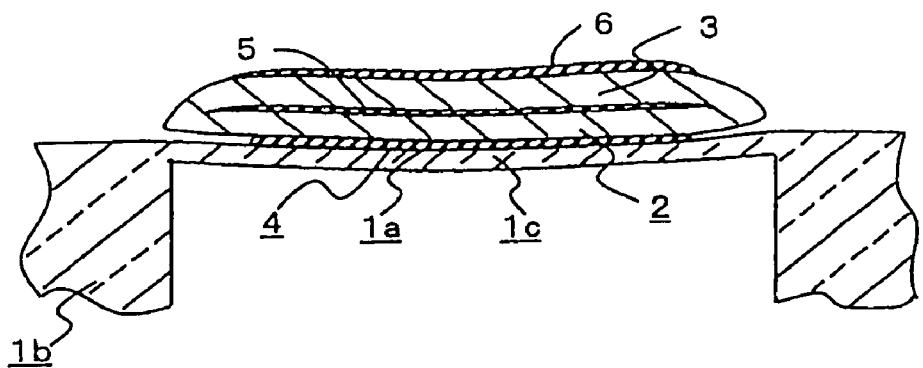
FIG. 7 is a sectional view showing another more specific example of the embodiment shown in FIG. 3.
Figure 8:
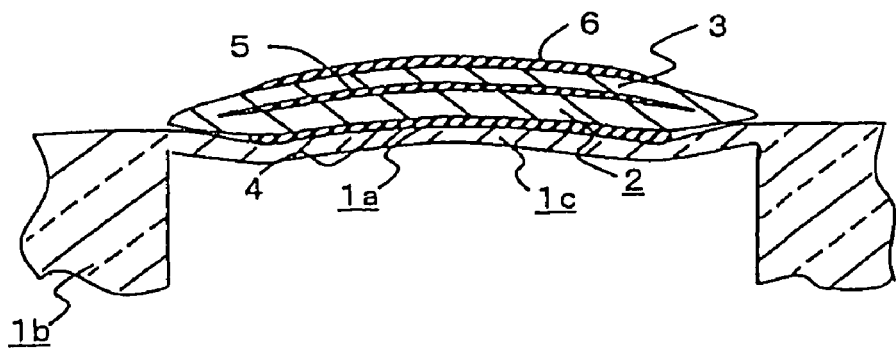
FIG. 8 is a sectional view showing still another more specific example of the embodiment shown in FIG. 3.

Moreover, as the shape of the thin portion of the substrate, which has a high linearity of the flexural displacement with respect to an electric field, there is preferably a shape including a central portion bent on a side opposite to the surface on which the piezoelectric/electrostrictive portions 2, 3 are disposed as shown in FIG. 7, or a W-shape whose sectional shape in a thickness direction has three inflection points as shown in FIG. 8. It is to be noted that the bent shape shown in FIG. 7 can be formed utilizing contraction in a step of sintering the respective piezoelectric/electrostrictive portions 2, 3. The W-shape shown in FIG. 8 can be formed by adjusting of sintering contraction start timings or sintering contraction amounts of the piezoelectric/electrostrictive portions 2, 3, and the shape of the thin portion 1c.

In the piezoelectric/electrostrictive film type element of the present embodiment, the electrode is electrically connected to the piezoelectric/electrostrictive portion, and is disposed between the respective piezoelectric/electrostrictive portions. The electrode is preferably disposed including a region which substantially contributes to the flexural displacement or the like of the piezoelectric/electrostrictive portion. For example, the electrodes 4, 5, 6 are preferably disposed in the region of 80 area % or more including the vicinity of the central portion of the surface on which the first piezoelectric/electrostrictive portion 12 and the second piezoelectric/electrostrictive portion 13 are formed as shown in FIG. 3.

Figure 5A:
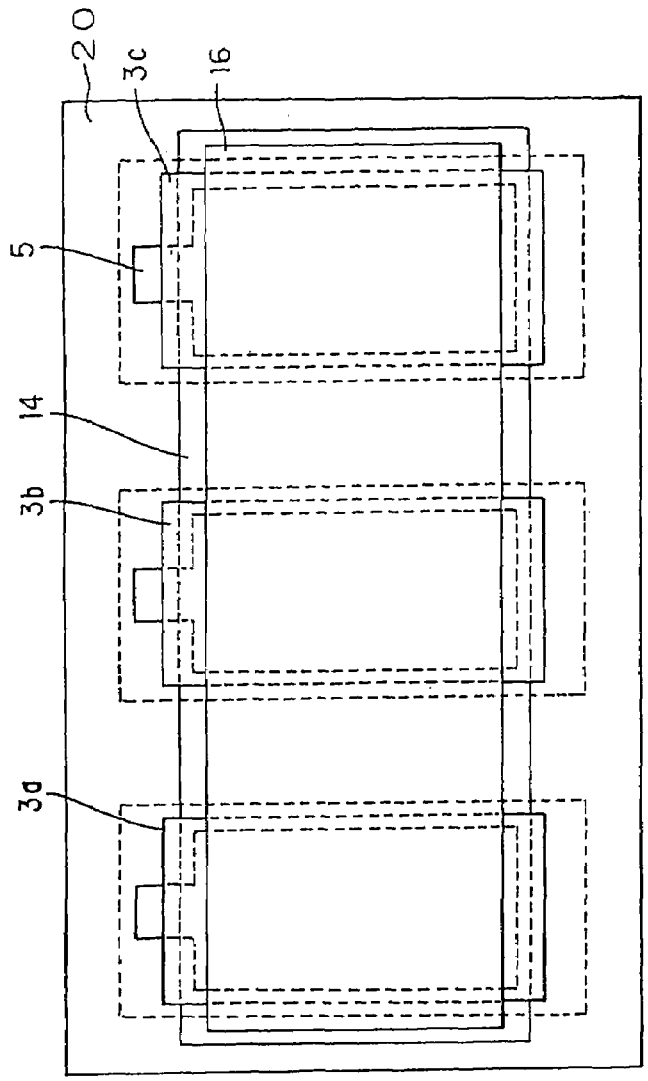
FIG. 5(a) is a top plan view schematically showing still another embodiment of the piezoelectric/electrostrictive film type element of the present invention.
Figure 5B:
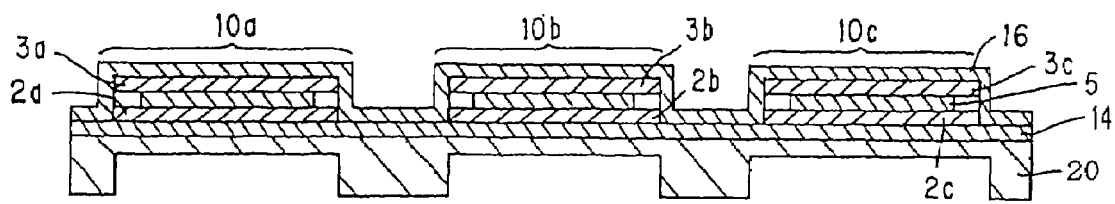
FIG. 5(b) is a sectional view schematically showing still another embodiment of the piezoelectric/electrostrictive film type element of the present invention.

Moreover, as shown in FIGS. 5(a), 5(b), when a plurality of piezoelectric/electrostrictive film type element units 10a to 10c share the common substrate 20, the respective piezoelectric/electrostrictive film type element units 10a to 10c share an electrode 14 of a lowermost layer and an electrode 16 of an uppermost layer of each of the piezoelectric/electrostrictive film type element units 10a to 10c, and the integral electrode 14 may be disposed in a region corresponding to the respective piezoelectric/electrostrictive portions 2a to 2c, 3a to 3c. When the integral electrode 14 is formed, the electrode does not have to be formed into a shape which corresponds to the individual piezoelectric/electrostrictive portions 2a to 2c, 3a to 3c, and positioning is facilitated in forming the electrode.

Figure 6:
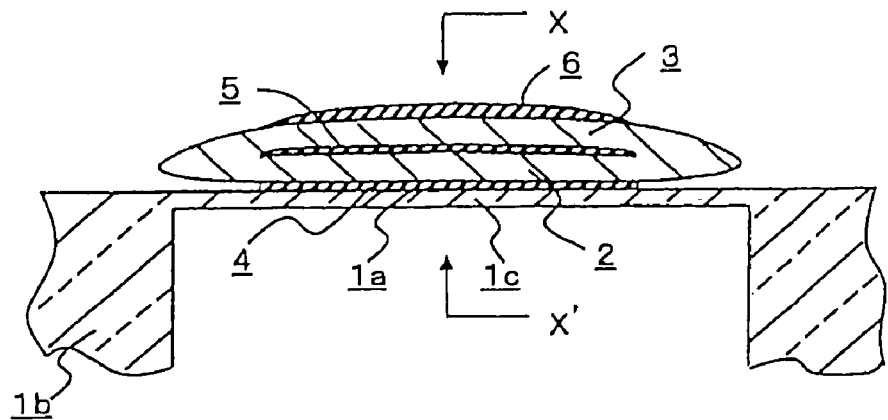
FIG. 6 is a sectional view showing a more specific example of the embodiment shown in FIG. 3.
Figure 9:
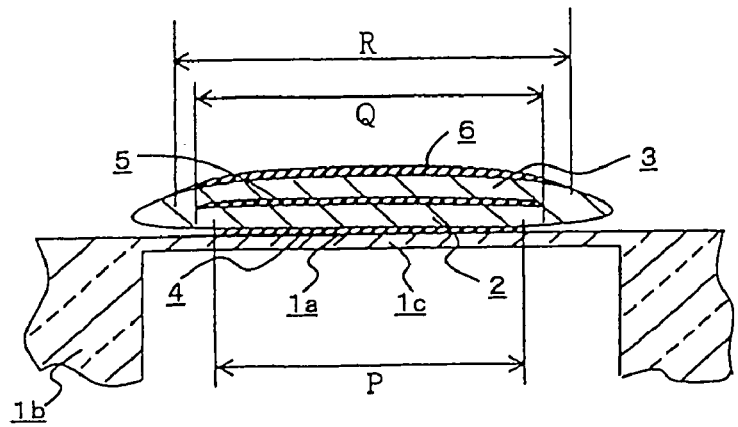
FIG. 9 is a sectional view showing still another more specific example of the embodiment shown in FIG. 3.
Figure 12A:
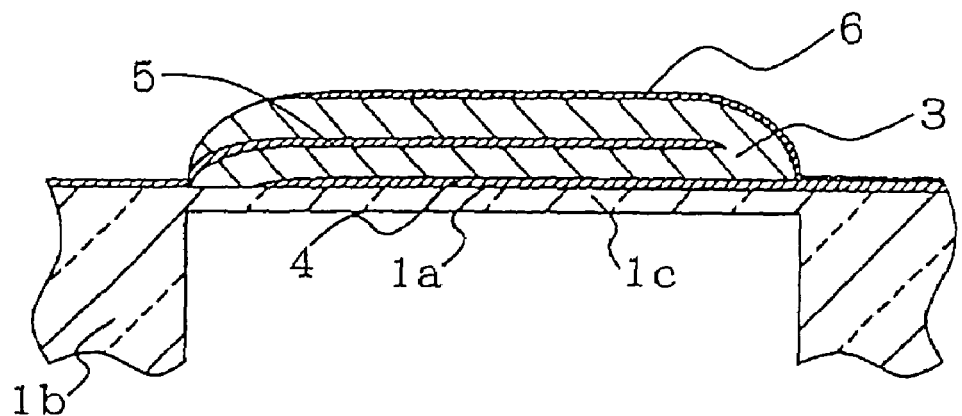
FIG. 12(a) is an X-X' sectional view of the embodiment shown in FIG. 6.
Figure 12B:
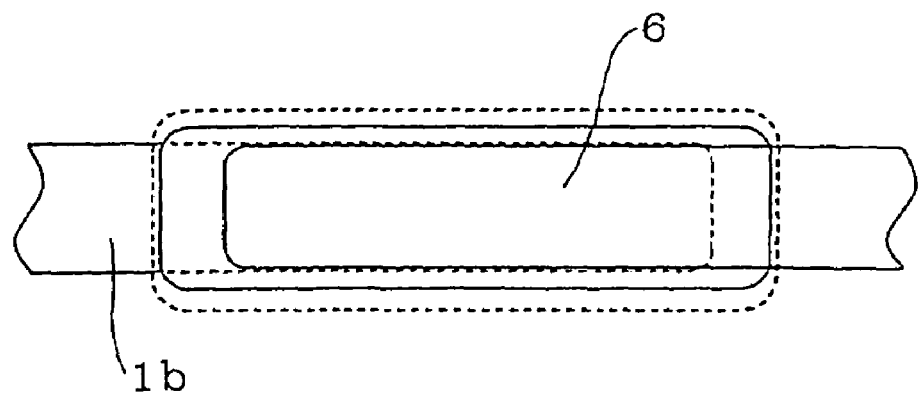
FIG. 12(b) is a top plan view of the embodiment shown in FIG. 6.

In the piezoelectric/electrostrictive film type element of the present embodiment, examples of a material of the electrode include at least one metal selected from a group consisting of Pt, Pd, Rh, Au, Ag, and an alloy of them. Above all, platinum or an alloy containing platinum as a main component is preferable because heat resistance is high in sintering the piezoelectric/electrostrictive portion. Since the piezoelectric/electrostrictive portion can be formed at a lower sintering temperature, an alloy such as Ag—Pd is also preferably usable. There is not any special restriction as to a dimension of the electrode. For example, as shown in FIGS. 6, 12(a), 12(b), the respective electrodes 4, 5, 6 may be provided with equal dimensions, and disposed in corresponding positions in the same region of the thickness direction. As shown in FIG. 9, the respective electrodes 4, 5, 6 are preferably disposed in broader regions including the corresponding region of the electrode positioned in a lower layer in order from the electrode 4 positioned in the lowermost layer. According to this constitution, since the piezoelectric/electrostrictive portion positioned in an upper layer can be distorted more largely than that positioned in a lower layer, a bend efficiency can be increased, and the flexural displacement can be more effectively developed.

Figure 10:
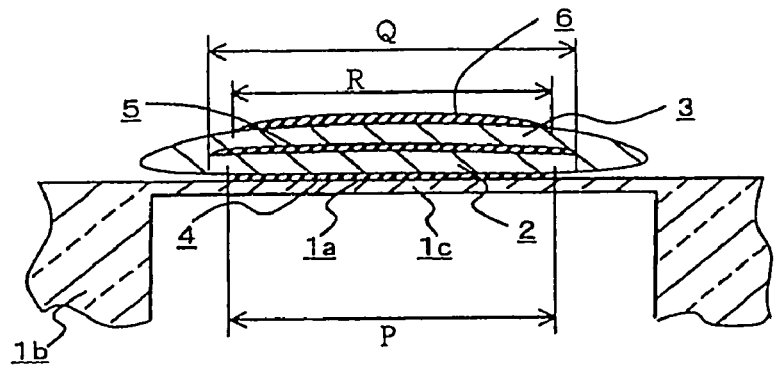
FIG. 10 is a sectional view showing still another more specific example of the embodiment shown in FIG. 3.
Figure 11:
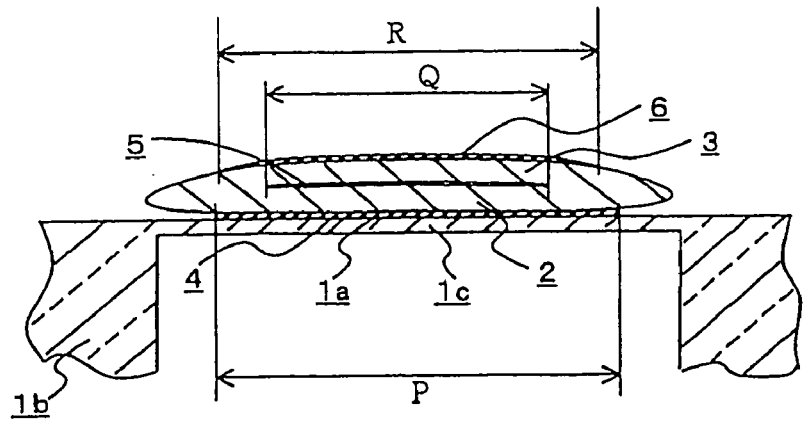
FIG. 11 is a sectional view showing still another more specific example of the embodiment shown in FIG. 3.

Additionally, in order to obtain a larger flexural displacement by increasing of a driving voltage of the piezoelectric/electrostrictive film type element, as shown in FIG. 10, the intermediately positioned electrode 5 is disposed in a region broader than that of the electrode 4 or 6 positioned in the lower or upper layer of the intermediate electrode. Alternatively, as shown in FIG. 11, the intermediately positioned electrode 5 is preferably disposed in a region smaller than that of the electrode 4 or 6. According to this constitution, the electric field is hardly added to the vicinity of an end portion (short direction) in which the thicknesses of the piezoelectric/electrostrictive portions 2, 3 are easily reduced, and dielectric breakdown of the piezoelectric/electrostrictive portion 2 or 3 can be avoided. In a case where a breadth difference is disposed in the region where the electrode is disposed, the breadth difference is preferably optimized in consideration of an electric field distribution. For example, between the electrodes 4, 5 (or 5, 6) disposed adjacent to each other via the piezoelectric/electrostrictive portion 2 (or 3), a value of a ratio of an area (area of a formed surface) where the electrode is disposed is preferably 0.5 to 2, more preferably 0.67 to 1.5, especially preferably 0.83 to 1.2. It is to be noted that in FIGS. 9 to 11, symbol P denotes a width of the lower electrode, Q denotes a width of the intermediate electrode, and R denotes a width of the upper electrode.

Figure 13:
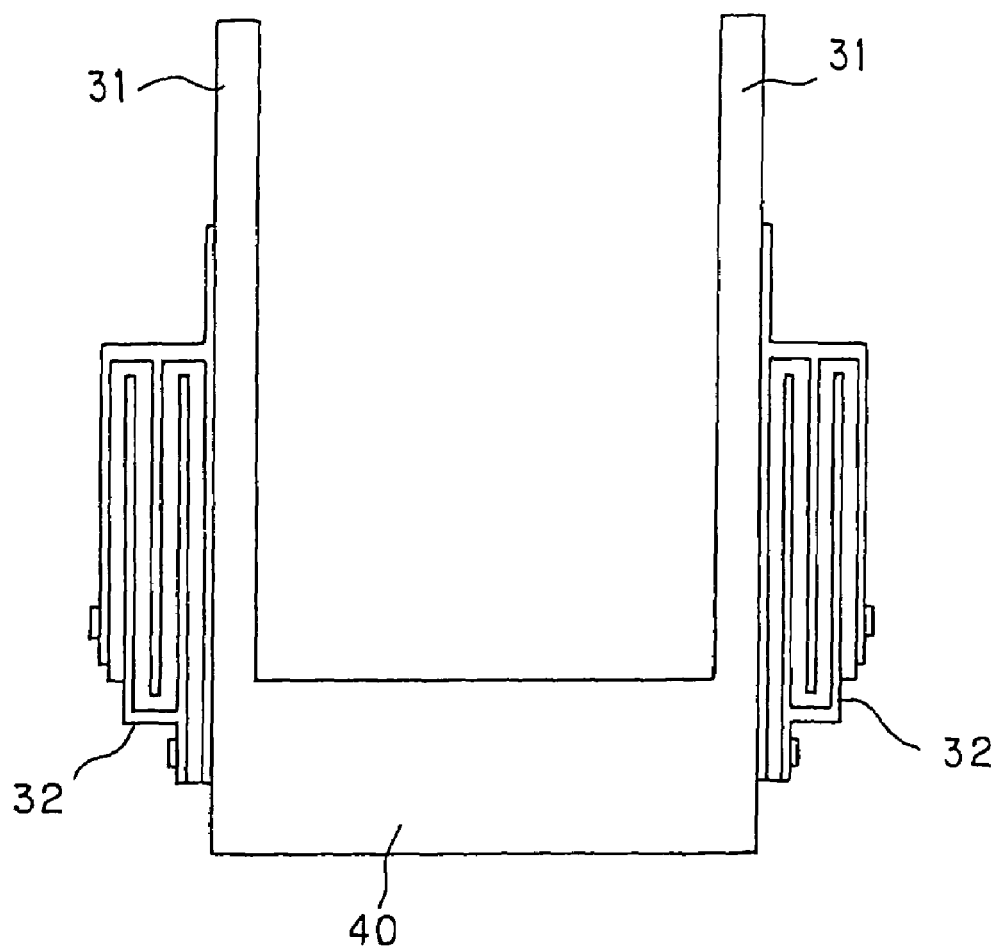
FIG. 13 is a front view showing an example in which the piezoelectric/electrostrictive film type element of the present invention is applied to an actuator for a hard disk.

It is to be noted that when the piezoelectric/electrostrictive film type element of the present invention is used, it is possible to constitute an actuator for a hard disk, for example, as shown in FIG. 13. That is, the actuator for the hard disk shown in FIG. 13 comprises a ceramic article 40 having arm portions 31, and piezoelectric/electrostrictive function portion 32 disposed on the arm portions 31. The arm portions 31 function as vibrating plates, and the actuator has satisfactory vibration characteristics as desired.

Figure 14:
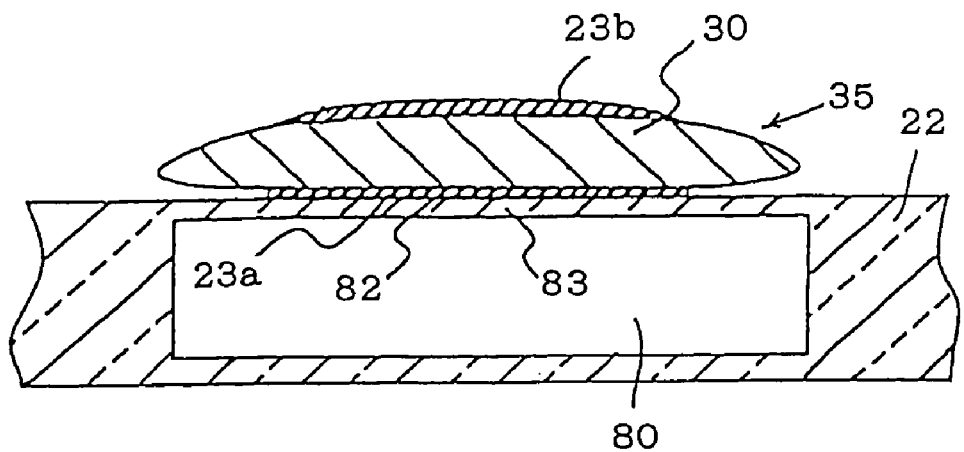
FIG. 14 is a sectional view schematically showing still another embodiment of the piezoelectric/electrostrictive film type element of the present invention.
Figure 15:
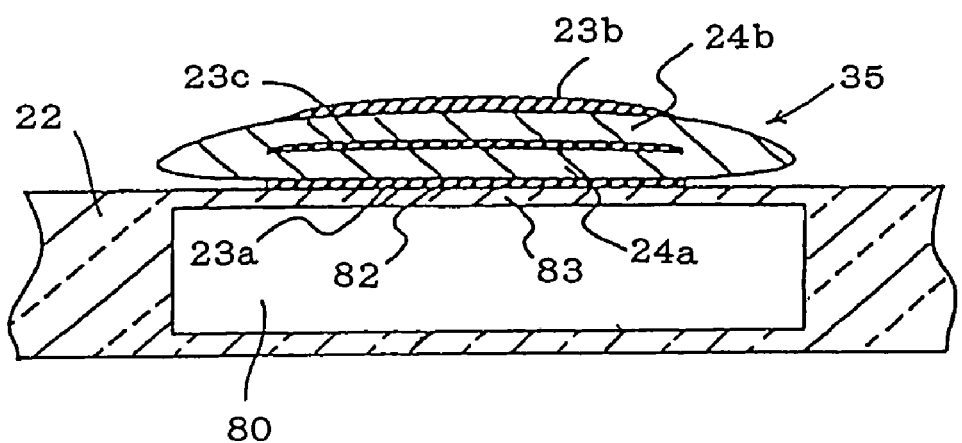
FIG. 15 is a sectional view schematically showing still another embodiment of the piezoelectric/electrostrictive film type element of the present invention.

FIG. 14 shows a schematic showing another embodiment of a piezoelectric/electrostrictive film type element of the present invention. As shown in FIG. 14, one may provide a piezoelectric/electrostrictive function portion 35 wherein the lower electrode 23a, the piezoelectric/electrostrictive portion 30, and the upper electrode 23b are layered in this order on the surface of substrate having a cavity 80 (the face of the portion to be bonded 82). As shown in FIG. 15, one may also provide a so-called multilayered piezoelectric/electrostrictive function portion 35 wherein the lower electrode 23a, the first piezoelectric/electrostrictive portion 24a, and the intermediate electrode 23c, the second piezoelectric/electrostrictive portion 24b, and the upper electrode 23b are layered in this order on the surface of substrate 22 having a cavity 80 (the face of the portion to be bonded 82).

Figure 16:
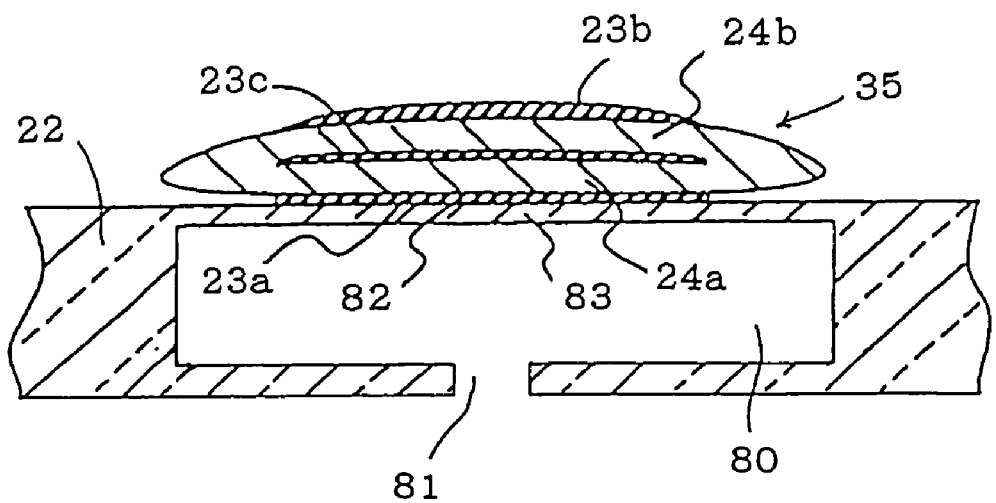
FIG. 16 is a sectional view schematically showing still another embodiment of the piezoelectric/electrostrictive film type element of the present invention.
Figure 17:
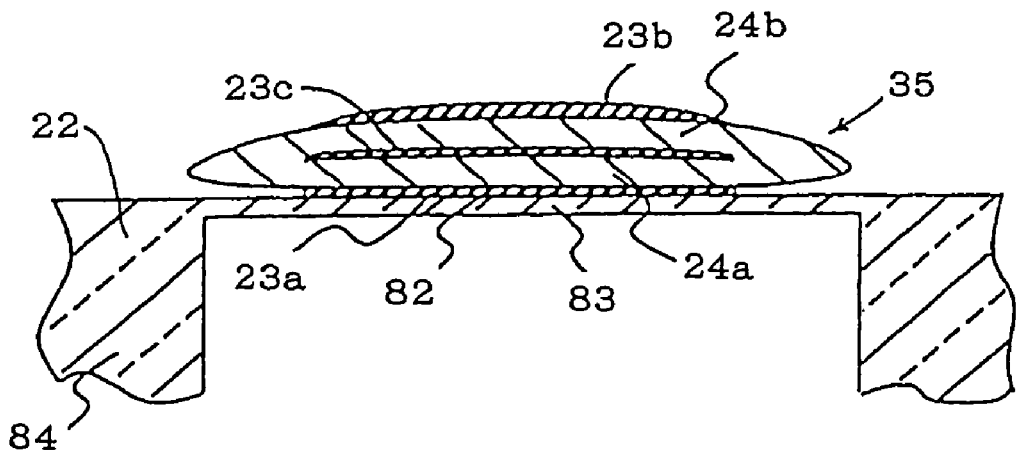
FIG. 17 is a sectional view schematically showing still another embodiment of the piezoelectric/electrostrictive film type element of the present invention.

As shown in FIG. 16, one may provide a piezoelectric/electrostrictive function portion 35 wherein the lower electrode 23a, the piezoelectric/electrostrictive portion 30, and the upper electrode 23b are layered in this order on the surface of substrate 22 having a cavity 80 having a specified hole 81 (the face of the portion to be bonded 82). As shown in FIG. 17, one may provide the piezoelectric/electrostrictive function portion 35 on a portion having thin thickness 83 of substrate 22 having the portion having thin thickness 83 and the portion having thick thickness 84 (the face of the portion to be bonded 82).

In the piezoelectric/electrostrictive film type element of the present embodiment, the thickness of the electrode is preferably 15 µm or less, more preferably 5 µm or less. When the thickness is over 15 µm, the electrode functions as a relaxation layer, and the flexural displacement diminishes in some case. It is to be noted that from a viewpoint that a substantial function of the electrode be exerted, the thickness of the electrode may be 0.05 µm or more.

Next, a method of preparing the piezoelectric/electrostrictive porcelain composition will be described according to the embodiment of the present invention. The piezoelectric/electrostrictive porcelain composition of the present embodiment is prepared by mixing of elements constituting the composition, an oxide of each element, carbonate, a compound containing a plurality of kinds of elements, or the like in such a manner that contents of the respective elements have a desired composition ratio. As a mixing method, a general method may be used, and examples of the method include ball milling. Specifically, predetermined amounts of certain raw materials, balls, and water are placed in a ball milling device, and the device is rotated as long as a predetermined time to prepare a mixed slurry. Thereafter, a water content contained in the resultant mixed slurry is evaporated, dried, filtered, or removed otherwise, so that the mixed raw materials can be obtained.

When the resultant mixed raw materials are calcined, the piezoelectric/electrostrictive porcelain composition can be obtained. The calcining may be performed in atmospheric air or oxygen atmosphere. In the obtained piezoelectric/electrostrictive porcelain composition, as to a diffractive intensity by an X-ray diffraction device, a ratio of an intensity of the most intense diffraction line of a phase other than a perovskite phase with respect to that of the most intense diffraction line of the perovskite phase is preferably 5% or less, more preferably 2% or less.

When the resultant piezoelectric/electrostrictive porcelain composition is crushed using a general crushing device such as a ball mill, an attritor, or a bead mill, particulate (or powdered) piezoelectric/electrostrictive components can be obtained. The particulate piezoelectric/electrostrictive porcelain composition has a mean grain size of preferably 0.1 to 1.0 µm, more preferably 0.2 to 0.7 µm. It is to be noted that the grain size may be adjusted by a heat treatment of the powder of the crushed piezoelectric/electrostrictive porcelain composition at a predetermined temperature. In this case, finer particles are integrated with the other particles to constitute the powder having matched grain sizes, and it is preferably possible to form a piezoelectric/electrostrictive film having the matched grain sizes. The piezoelectric/electrostrictive porcelain composition may be prepared, for example, by an alkoxide process, a coprecipitation process or the like. It is to be noted that the method of preparing the piezoelectric/electrostrictive porcelain composition is described in more detail in Patent Documents 3 to 6 described above.

Next, a method of manufacturing the piezoelectric/electrostrictive article will be described according to the embodiment of the present invention. First, powder compacting is performed in such a manner that the powdered piezoelectric/electrostrictive porcelain composition obtained by the above-described method is formed into a desired size at an appropriate pressure. When the resultant compacted powder article is sintered at 800 to 1300° C. for one minute to ten hours, a sintered article having a predetermined shape can be obtained. Next, after the article is cut or worked otherwise into an appropriate size, the electrode is formed, and polarization is performed so that the piezoelectric/electrostrictive article (bulk article) can be obtained.

Moreover, to form the whole shape of the piezoelectric/electrostrictive article into the sheet-like shape, a plasticizer, a dispersant, a solvent or the like is added to the piezoelectric/electrostrictive porcelain composition, and the composition is formed into a slurry by use of a general mixing device such as a ball mill. Thereafter, the article can be formed into the sheet-like shape by a general sheet forming machine such as a doctor blade.

Next, a method of manufacturing the piezoelectric/electrostrictive film type element will be described according to the embodiment of the present invention. First, a layer constituted of the piezoelectric/electrostrictive porcelain composition is formed on the substrate made of the ceramic or the electrode formed on the substrate surface. Examples of a method of forming the electrode include an ion beam process, sputtering, vacuum evaporation, PVD, ion plating, CVD, plating, aerosol deposition, screen printing, spraying, dipping and the like. Above all, the sputtering process or the screen printing process is preferable in respect of bonding properties with respect to the substrate and the piezoelectric/electrostrictive portion. An appropriate temperature is selected depending on a material of the formed electrode, and the electrode can be integrated with the substrate and/or the piezoelectric/electrostrictive portion by the heat treatment at about 800 to 1400° C. This heat treatment may be performed every time the electrode is formed, or may be performed together with the sintering performed on a layer constituted of the piezoelectric/electrostrictive porcelain composition. Additionally, after forming the layer constituted of the piezoelectric/electrostrictive porcelain composition, the heat treatment is not performed at a temperature in excess of the sintering temperature of the layer constituted of the piezoelectric/electrostrictive porcelain composition.

Examples of a method of forming the layer constituted of the piezoelectric/electrostrictive porcelain composition on the substrate include an ion beam process, sputtering, vacuum evaporation, PVD, ion plating, CVD, plating, a sol-gel process, aerosol deposition, screen printing, spraying, dipping and the like. Above all, the screen printing process is preferable because the layer can be easily continuously formed into a high-precision shape and thickness. It is to be noted that to prepare the piezoelectric/electrostrictive film type element comprising a plurality of alternately held and layered piezoelectric/electrostrictive portions and electrodes, the electrode is formed on the layer constituted of the piezoelectric/electrostrictive porcelain composition formed on the substrate by a method similar to the above-described method. It is to be noted that on the electrode, the layer constituted of the piezoelectric/electrostrictive porcelain composition and the electrode are alternately and repeatedly formed until a desired multilayered constitution is obtained.

Thereafter, a layered article obtained by alternately laminating the layer constituted of the piezoelectric/electrostrictive porcelain composition and the electrode on the substrate is integrally sintered. By the sintering, the piezoelectric/electrostrictive portion comprising the crystal grains constituted of the piezoelectric/electrostrictive porcelain composition can be bonded to the substrate directly or via the electrode. It is to be noted that the sintering does not have to be necessarily integrally performed, and may be successively performed every time one layer constituted of the piezoelectric/electrostrictive porcelain composition is formed, but from a viewpoint of a production efficiency, the layers are preferably integrally sintered including the electrodes. The sintering temperature is preferably 950 to 1350° C., more preferably 1000 to 1300° C. A maximum temperature retaining time at the sintering time is preferably ten minutes or more and ten hours or less, more preferably 20 minutes or more and five hours or less. The sintering may be performed in atmospheric air or oxygen atmosphere.

Thereafter, the polarization is performed on appropriate conditions. In this case, the polarization is preferably performed by heating in the same manner as in a known method. It is to be noted that a heating temperature depends on Curie point of the piezoelectric/electrostrictive porcelain composition, and is preferably set at 40 to 200° C.

EXAMPLES

The present invention will be described hereinafter specifically based on examples, but the present invention is not limited to these examples.

Examples 1 to 4, Comparative Example 1

A substrate (1.6×1.1 mm×thickness of 10 μm) made of zirconia ($ZrO_2$) stabilized by yttria ($Y_2O_3$) was formed by a green sheet laminating process, and sintered. On the substrate, a lower electrode film (1.2×0.8 mm×thickness of 3 μm) made of platinum (Pt) was formed by a screen printing process, and integrated with the substrate by a heat treatment at 1300° C. for two hours. On the lower electrode film, a piezoelectric/electrostrictive porcelain composition represented by a composition formula shown in Table 1 was layered with a dimension of 1.3×0.9 mm×a thickness of 15 μm by the screen printing process, and sintered at 1200° C. for three hours. Further on the film, an upper electrode film (1.2×0.8 mm×thickness of 0.5 μm) made of gold (Au) was layered by the screen printing process, and thermally treated to manufacture piezoelectric/electrostrictive film type elements (Examples 1 to 4, Comparative Example 1).

(Measurement of Flexural Displacement)

Flexural displacements (μm) were measured with respect to the respective manufactured piezoelectric/electrostrictive film type elements of Examples 1 to 4 and Comparative Example 1 by the following method. Results are shown in Table 1.

[Flexural Displacement]: A voltage was applied between the upper and lower electrode films in such a manner as to obtain an electric field of 3 kV/mm, and the flexural displacement (μm) generated during the applying was measured by a laser displacement measuring unit. It is to be noted that in Table 1, "average" of "flexural displacement (μm)" is an average value in a case where ten piezoelectric/electrostrictive film type elements were manufactured in each of the examples and the comparative example, and the flexural displacements were measured, and "fluctuation" is a difference between a maximum value and a minimum value of the measured flexural displacements.

TABLE 1

|   | Composition formula of piezoelectric/electrostrictive porcelain composition | Flexural displacement (μm) | Fluctuation (μm) |
|---|---|---|---|
| Example 1 | 0.9 mol % $(Ag_{0.7}Li_{0.1}Na_{0.1}K_{0.1})(Nb_{0.7}Ta_{0.2}Sb_{0.05}V_{0.05})O_3$ + 0.1 mol % $Ag(Mg_{1/8}Nb_{2/8}W_{5/8})O_3$ | 1.18 | 0.07 |
| Example 2 | 0.9 mol % $(Ag_{0.7}Li_{0.1}Na_{0.15}K_{0.05})(Nb_{0.7}Ta_{0.2}Sb_{0.1})O_3$ + 0.1 mol % $Ba\{(Mg_{1/3}Nb_{2/3})_{0.1}Ti_{0.9}\}O_3$ | 1.25 | 0.07 |
| Example 3 | 0.95 mol % $(Ag_{0.8}Li_{0.1}Na_{0.1})(Nb_{0.7}Ta_{0.2}Sb_{0.05}V_{0.05})O_3$ + 0.05 mol % $(Ba_{0.5}Ce_{0.5})(Mg_{2/3}Nb_{1/3})O_3$ | 1.23 | 0.08 |
| Example 4 | 0.9 mol % $(Ag_{0.75}Li_{0.1}Na_{0.15})(Nb_{0.75}Ta_{0.2}Sb_{0.05})O_3$ + 0.1 mol % $Ba\{(Mg_{1/3}Nb_{2/3})_{0.1}Ti_{0.9}\}O_3$ + 0.5 mass % NiO | 1.19 | 0.05 |
| Comparative Example 1 | $Pb(Ti_{0.47}Zr_{0.53})O_3$ | 0.91 | 0.13 |

From the results shown in Table 1, it has been found that the piezoelectric/electrostrictive film type elements of Examples 1 to 4 exhibit sufficient flexural displacements, and less fluctuations of the flexural displacements as compared with the piezoelectric/electrostrictive film type element of Comparative Example 1.

A piezoelectric/electrostrictive article and a piezoelectric/electrostrictive film type element of the present invention exhibit superior piezoelectric/electrostrictive characteristics, and are preferable for an actuator, a sensor and the like.

What is claimed is:

1. A piezoelectric/electrostrictive porcelain composition having a main component comprising a binary solid solution represented by the following general formula (1):

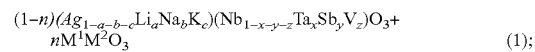

$$(1-n)(Ag_{1-a-b-c}Li_aNa_bK_c)(Nb_{1-x-y-z}Ta_xSb_yV_z)O_3 + nM^1M^2O_3 \qquad (1);$$

wherein $0 \leq a \leq 0.2$, $0 \leq b \leq 0.95$, $0 \leq c \leq 0.95$, $0 < (1-a-b-c) \leq 1$, $0 \leq x \leq 0.5$, $0.05 \leq y \leq 0.2$, $0 \leq z \leq 0.2$, $0 \leq (y+z) \leq 0.3$, $0 \leq n \leq 0.2$; and wherein $M^1$ and $M^2$ satisfy any of the following combinations A to C:

combination A: $M^1$ is a monovalent metal element, and $M^2$ is a combination of two or more kinds of metal elements which are quinquevalent on average;

combination B: $M^1$ is a bivalent metal element or a combination of two or more kinds of metal elements which are bivalent on average, and $M^2$ is a quadrivalent metal element or a combination of two or more kinds of metal elements which are quadrivalent on average; and combination C: $M^1$ is a tervalent metal element or a combination of two or more kinds of metal elements which are tervalent on average, and $M^2$ is a tervalent metal element or a combination of two or more kinds of metal elements which are tervalent on average.

2. The piezoelectric/electrostrictive porcelain composition according to claim 1, comprising an oxide of at least one kind of metal element selected from the group consisting of Li, Na, Mg, Al, Si, K, Ca, Sc, Ti, V, Cr, Mn, Fe, Co, Ni, Cu, Zn, Ga, Ge, Rb, Sr, Y, Zr, Nb, Mo, Pd, Ag, Cd, In, Sn, Sb, Ba, Hf, Ta, W, Pt, Au, Pb, Bi, La, Ce, Pr, Nd, Sm, Eu, Gd, Tb, Dy, Ho, Er, Tm, Yb, and Lu.

3. A piezoelectric/electrostrictive article comprising crystal grains of a piezoelectric/electrostrictive porcelain composition having a main component comprising a binary solid solution represented by the following general formula (1):

$$(1-n)(Ag_{1-a-b-c}Li_aNa_bK_c)(Nb_{1-x-y-z}Ta_xSb_yV_z)O_3 + nM^1M^2O_3 \quad (1);$$

wherein $0 \leq a \leq 0.2$, $0 \leq b \leq 0.95$, $0 \leq c \leq 0.95$, $0 < (1-a-b-c) \leq 1$, $0 \leq x \leq 0.5$, $0.05 \leq y \leq 0.2$, $0 \leq z \leq 0.2$, $0 \leq (y+z) \leq 0.3$, $0 \leq n \leq 0.2$; and $M^1$ and $M^2$ satisfy any of the following combinations A to C:

combination A: $M^1$ is a monovalent metal element, and $M^2$ is a combination of two or more kinds of metal elements which are quinquevalent on average;

combination B: $M^1$ is a bivalent metal element or a combination of two or more kinds of metal elements which are bivalent on average, and $M^2$ is a quadrivalent metal element or a combination of two or more kinds of metal elements which are quadrivalent on average; and combination C: $M^1$ is a tervalent metal element or a combination of two or more kinds of metal elements which are tervalent on average, and $M^2$ is a tervalent metal element or a combination of two or more kinds of metal elements which are tervalent on average.

4. The piezoelectric/electrostrictive article according to claim 3, wherein the piezoelectric/electrostrictive porcelain composition comprises an oxide of at least one kind of metal element selected from the group consisting of Li, Na, Mg, Al, Si, K, Ca, Sc, Ti, V, Cr, Mn, Fe, Co, Ni, Cu, Zn, Ga, Ge, Rb, Sr, Y, Zr, Nb, Mo, Pd, Ag, Cd, In, Sn, Sb, Ba, Hf, Ta, W, Pt, Au, Pb, Bi, La, Ce, Pr, Nd, Sm, Eu, Gd, Tb, Dy, Ho, Er, Tm, Yb, and Lu.

5. The piezoelectric/electrostrictive article according to claim 4, wherein an entire shape of the piezoelectric/electrostrictive article is in the form of a sheet.

6. The piezoelectric/electrostrictive article according to claim 3, wherein an entire shape of the piezoelectric/electrostrictive article is in the form of a sheet.

7. A piezoelectric/electrostrictive film-type element comprising:
a thin ceramic substrate;
a film-like piezoelectric/electrostrictive portion; and
a film-like electrode electrically connected to the piezoelectric/electrostrictive portion;

wherein the piezoelectric/electrostrictive portion is bonded onto the ceramic substrate directly or via the electrode; and wherein the piezoelectric/electrostrictive portion comprises crystal grains of a piezoelectric/electrostrictive porcelain composition having a main component comprising a binary solid solution represented by the following general formula (1):

$$(1-n)(Ag_{1-a-b-c}Li_aNa_bK_c)(Nb_{1-x-y-z}Ta_xSb_yV_z)O_3 + nM^1M^2O_3 \quad (1);$$

wherein $0 \leq a \leq 0.2$, $0 \leq b \leq 0.95$, $0 \leq c \leq 0.95$, $0 < (1-a-b-c) \leq 1$, $0 \leq x \leq 0.5$, $0.05 \leq y \leq 0.2$, $0 \leq z \leq 0.2$, $0 \leq (y+z) \leq 0.3$, $0 \leq n \leq 0.2$; and $M^1$ and $M^2$ satisfy any of the following combinations A to C:

in combination A, $M^1$ is a monovalent metal element, and $M^2$ is a combination of two or more kinds of metal elements which are quinquevalent on average, in combination B, $M^1$ is a bivalent metal element or a combination of two or more kinds of metal elements which are bivalent on average, and $M^2$ is a quadrivalent metal element or a combination of two or more kinds of metal elements which are quadrivalent on average, and in combination C, $M^1$ is a tervalent metal element or a combination of two or more kinds of metal elements which are tervalent on average, and $M^2$ is a tervalent metal element or a combination of two or more kinds of metal elements which are tervalent on average.

8. The piezoelectric/electrostrictive film-type according to claim 7, wherein the piezoelectric/electrostrictive porcelain composition comprises an oxide of at least one kind of metal element selected from the group consisting of Li, Na, Mg, Al, Si, K, Ca, Sc, Ti, V, Cr, Mn, Fe, Co, Ni, Cu, Zn, Ga, Ge, Rb, Sr, Y, Zr, Nb, Mo, Pd, Ag, Cd, In, Sn, Sb, Ba, Hf, Ta, W, Pt, Au, Pb, Bi, La, Ce, Pr, Nd, Sm, Eu, Gd, Tb, Dy, Ho, Er, Tm, Yb, and Lu.

9. The piezoelectric/electrostrictive film-type element according to claim 8, comprising a plurality of piezoelectric/electrostrictive portions and a plurality of electrodes, wherein the plurality of piezoelectric/electrostrictive portions are alternately held and layered with the plurality of electrodes.

10. The piezoelectric/electrostrictive film-type element according to claim 9, wherein one of the piezoelectric/electrostrictive portions has a thickness in a range of 0.5 to 50 μm.

11. The piezoelectric/electrostrictive film-type element according to claim 7, comprising a plurality of piezoelectric/electrostrictive portions and a plurality of electrodes, wherein the plurality of piezoelectric/electrostrictive portions are alternately held and layered with the plurality of electrodes.

12. The piezoelectric/electrostrictive film-type element according to claim 11, wherein one of the piezoelectric/electrostrictive portions has a thickness in a range of 0.5 to 50 μm.

* * * * *